(12) United States Patent
Kim

(10) Patent No.: US 9,953,700 B2
(45) Date of Patent: Apr. 24, 2018

(54) DATA OUTPUT CIRCUIT AND SEMICONDUCTOR MEMORY DEVICE INCLUDING THE SAME

(71) Applicant: SK hynix Inc., Gyeonggi-do (KR)

(72) Inventor: Bo-Kyeom Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/280,005

(22) Filed: Sep. 29, 2016

(65) Prior Publication Data

US 2017/0323678 A1 Nov. 9, 2017

(30) Foreign Application Priority Data

May 9, 2016 (KR) .................. 10-2016-0056488

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ... G11C 11/419; G11C 11/418; G11C 11/413; G11C 11/4091; G11C 7/1051; G11C 7/1078; G11C 7/065
USPC .................................. 365/189.05, 154, 205
See application file for complete search history.

(56) References Cited

U.S. PATENT DOCUMENTS 7,363,555 B2 * 4/2008 Lee ..................... G11C 29/1201
 714/710
7,826,303 B2 * 11/2010 Ko ....................... G11C 7/1039
 365/189.05
2012/0140573 A1 * 6/2012 Kim ..................... G11C 7/1039
 365/189.05

FOREIGN PATENT DOCUMENTS

KR 101218919 1/2013
KR 1020160076204 6/2016

* cited by examiner

*Primary Examiner* — Alexander Sofocleous
*Assistant Examiner* — Alfredo Bermudez Lozada
(74) *Attorney, Agent, or Firm* — IP & T Group LLP

(57) ABSTRACT

A data output circuit includes: a first data latch unit enabled in response to a first bank selection signal including clock information, for storing first lower bank data and first upper bank data in response to a first input control signal, and outputting lower preliminary output data and upper preliminary output data in response to an output control signal; a second data latch unit enabled in response to a second bank selection signal including clock information, for storing second lower bank data and second upper bank data in response to a second input control signal, and outputting the lower preliminary output data and the upper preliminary output data in response to the output control signal; and a data output unit for driving the lower preliminary output data to send rising output data, and synchronizing the upper preliminary output data with the clock to send falling output data.

18 Claims, 10 Drawing Sheets

| AX<1> | BANK_LOAD | BA_CTRL1 | BA_CTRL2 |
|-------|-----------|----------|----------|
| 0 | 0 | 0 | 1 |
| 0 | 1 | 1 | 1 |
| 1 | 0 | 0 | 1 |
| 1 | 1 | 0 | 0 |

DATA OUTPUT CIRCUIT AND SEMICONDUCTOR MEMORY DEVICE INCLUDING THE SAME

CROSS-REFERENCE TO RELATED APPLICATIONS

The present application claims priority of Korean Patent Application No. 10-2016-0056488, filed on May 9, 2016, which is incorporated herein by reference in its entirety.

BACKGROUND

1. Field

Exemplary embodiments of the present invention relate generally to a semiconductor technology and, more particularly, to a semiconductor memory device for performing a data output operation in response to a read command.

2. Description of the Related Art

As related technology progresses, semiconductor memory devices are required to operate faster while consuming less power.

Generally, according to the current state of the semiconductor memory device technology, data are transferred in synchronization with a reference clock signal for increasing the data input/output rate of a semiconductor memory device. Furthermore, data are typically transferred in synchronization with both a rising edge and a falling edge of a reference clock signal.

Semiconductor memory devices are requested to send or receive a plurality of data (e.g., 16, 32 or 64 bit data) simultaneously to perform such high-speed operation. To send a plurality of data simultaneously, a semiconductor memory device typically includes peripheral circuits, such as a plurality of data output buffers and data lines corresponding to a plurality of respective output data.

In particular, recently introduced technology relates to a semiconductor memory device equipped with a pipe register for storing a plurality of output data therein for increasing the data output rate. When a pipe register is employed, an operation of outputting data includes transferring the data that are already stored in the pipe register to an external device, such as a host, through a DQ pad. To achieve a high-speed operation, it may be required to improve the timing margin between a control signal employed for controlling the operation of the pipe register and the data outputted from the pipe register.

SUMMARY

Embodiments of the present invention are directed to a data output circuit that may perform a data output operation at a high-speed, and a semiconductor memory device including the data output circuit.

According to an embodiment an embodiment of the present invention, a data output circuit includes: a first data latch unit that is enabled in response to a first bank selection signal including information of a clock, suitable for storing a first lower bank data and a first upper bank data in response to a first input control signal, and suitable for outputting the stored first lower and upper bank data as a lower preliminary output data and an upper preliminary output data in response to an output control signal; a second data latch unit that is enabled in response to a second bank selection signal including the information of the clock, suitable for storing a second lower bank data and a second upper bank data in response to a second input control signal, and suitable for outputting the stored second lower and upper bank data as the lower preliminary output data and the upper preliminary output data in response to the output control signal; and a data output unit suitable for driving the lower preliminary output data to send a rising output data, and synchronizing the upper preliminary output data with the clock to send a falling output data.

According to an embodiment another embodiment of the present invention, a semiconductor memory device includes: a page buffer group suitable for storing bank data received from a plurality of banks in response to a read command; a data output circuit that is enabled in response to a bank selection signal, for storing the bank data received from the page buffer group in response to an input control signal, and for outputting the stored bank data to an input/output pad in response to an output control signal, wherein a first bit group of the bank data is delayed by a predetermined time and transferred as a rising output data, and a second bit group of the bank data is synchronized with a clock and transferred as a falling output data; and a control logic suitable for generating the input control signal and the output control signal for performing a data output operation, and generating the bank selection signal by reflecting information of the clock.

According to an embodiment yet another embodiment of the present invention, a signal generation apparatus includes: a first control signal generator suitable for generating a first control signal which is enabled in response to an address strobe signal, when an address signal representing a first bank is inputted; a second control signal generation unit suitable for generating a second control signal which is enabled in response to the address strobe signal, when the address signal representing a second bank is inputted; a flip-flop unit suitable for receiving a clock at a clock terminal, the first control signal at a reset terminal, an inverted signal of the second control signal at a set terminal, and an inverted output signal of the flip-flop unit at an input terminal; and a clock information reflecting unit suitable for generating the first selection signal and the second selection signal by reflecting information of the clock into the inverted output signal and the output signal of the flip-flop unit.

BRIEF DESCRIPTION OF THE DRAWINGS

These and other features and advantages of the present invention will become apparent to those skilled in the art to which the present invention pertains after reading the following detailed description of specific embodiments of the present invention in reference with the accompanying drawings wherein.

DETAILED DESCRIPTION

Figure 1:
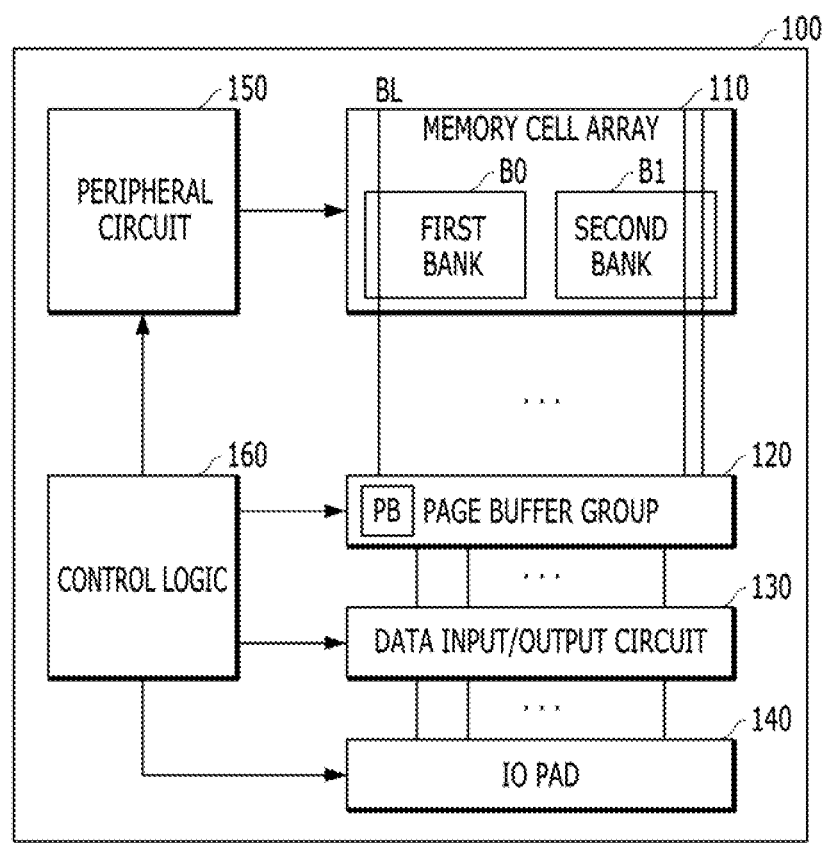
FIG. 1 is a block diagram illustrating a semiconductor memory device according to an embodiment of the present invention.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily drawn to scale and, in some instances, proportions may have been exaggerated for more clearly illustrating the various elements of the embodiments. For example, in the drawings, the size of elements and the intervals between elements may be exaggerated compared to actual sizes and intervals for facilitating the illustration of these elements.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of any stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process configurations and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Referring now to FIG. 1, a semiconductor memory device 100 is provided, according to an embodiment of the present invention.

The semiconductor memory device 100 includes a memory cell array 110, a page buffer group 120, a data input/output circuit 130, an input/output (IO) pad 140, a peripheral circuit 150, and a control logic 160.

The memory cell array 110 includes memory cells for storing data. The memory cells are coupled to word lines (not shown) and bit lines BL. The memory cell array 110 includes a first bank B0 and a second bank B1. Although FIG. 1 shows that the memory cell array 110 includes two banks, the memory cell array 110 may include three or more banks.

The page buffer group 120 includes a plurality of page buffers PB. Each of the page buffers PB is coupled to at least one bit line BL, and it temporarily stores data to be stored in a selected memory cell or reads data from a selected memory cell.

The data input/output circuit 130 operates for data input/output between the page buffer group 120 and the IO pad 140. The data input/output circuit 130 includes a sensing circuit or a sense amplifier (not shown) that senses the data transferred from the page buffer group 120 and transfers the sensed data to the IO pad 140.

The IO pad 140 includes data input/output pads, which are DQ pads, connected to an external device such as a host of the semiconductor memory device 100.

The peripheral circuit 150 includes circuits that read data from the memory cells or operate along with the page buffer group 120 when data are stored in the memory cells.

The control logic 160 outputs control signals for controlling the operations of the page buffer group 120, the data input/output circuit 130, the IO pad 140, and the peripheral circuit 150.

Meanwhile, the data input/output circuit 130 may include a pipe register (see FIG. 2) for storing a plurality of data inside for increasing the data output rate. A data output operation includes a process of transferring the data that are stored in the pipe register to an external device such as a host of the semiconductor memory device 100 through the DQ pad of the IO pad 140.

Figure 2:
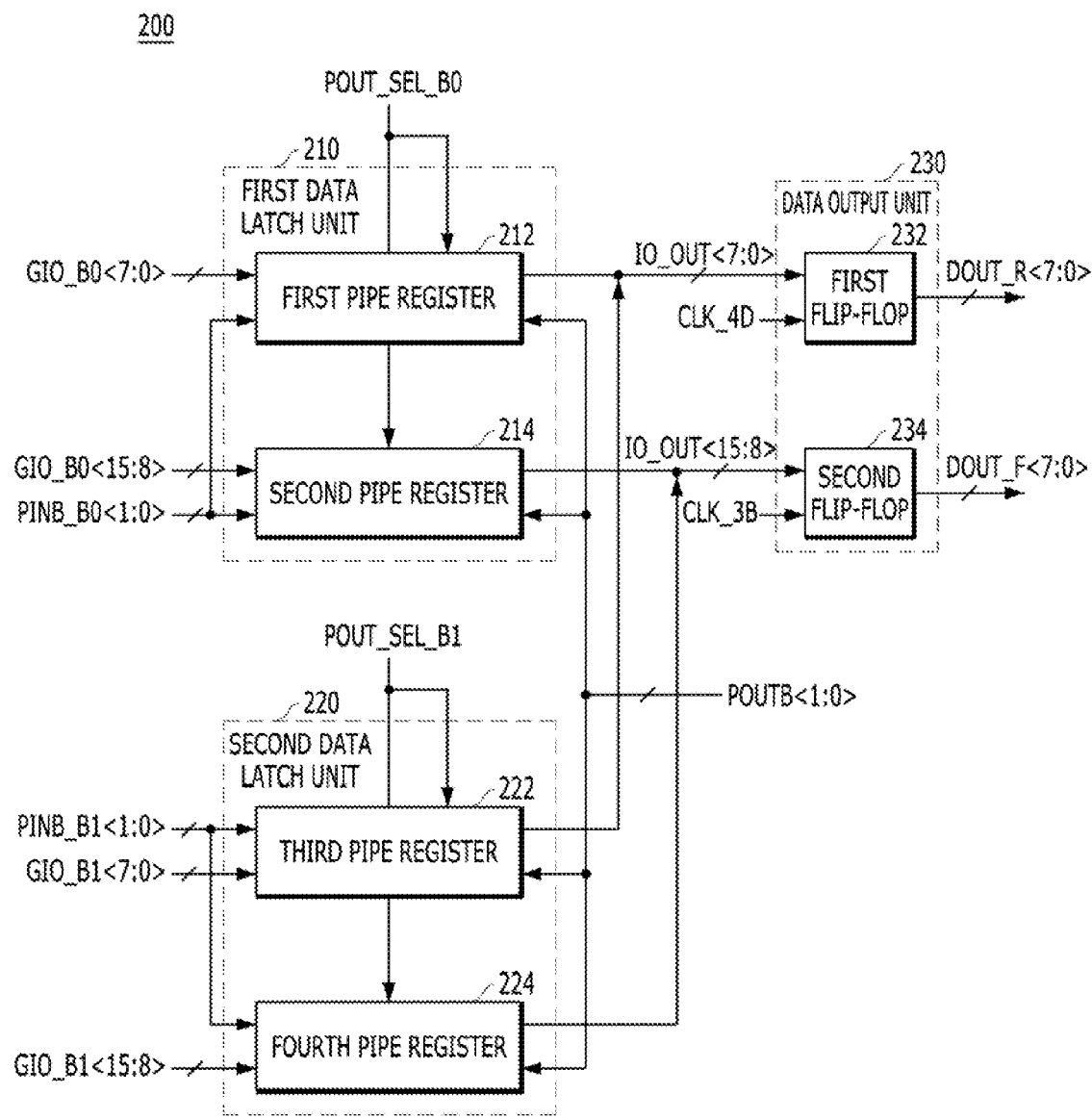
FIG. 2 is a block diagram illustrating a data output circuit of a data input/output circuit shown in FIG. 1.

FIG. 2 illustrates an example of a data output circuit 200 of the data input/output circuit 130 of FIG. 1. FIG. 2 shows a configuration suitable for transferring bank data GIO_B0<15:0> and GI0_B1<15:0> to the IO pad 140. The bank data GIO_B0<15:0> and GIO_B1<15:0>, are transferred through at least one respective global input/output (GIO) line provided for each bank B0 and B1.

Referring to FIG. 2, the data output circuit 200 includes a first data latch unit 210 that receives and stores a first bank data GIO_B0<15:0> transferred from a first bank B0 (see FIG. 1), a second data latch unit 220 that receives and stores a second bank data GIO_B1<15:0> transferred from a second bank B1 (see FIG. 1), and a data output unit 230 that synchronizes a preliminary output data IO_OUT<15:0> transferred from the first data latch unit 210 or the second data latch unit 220 with clocks CLK_3B and CLK_4D, and outputs final synchronized output data DOUT_R<7:0> and DOUT_F<7:0>.

The first data latch unit 210 includes first and second pipe registers 212 and 214. Each of the first and second pipe registers 212 and 214 may be enabled in response to a first bank selection signal POUT_SEL_B0. The first pipe register 212 stores a first lower bank data GIO_B0<7:0> in response to a first pipe input control signal PINB_B0<1:0>, and outputs the stored data as a lower preliminary output data IO_OUT<7:0> in response to a pipe output control signal POUTB<1:0>. The second pipe register 214 stores a first upper bank data GIO_B0<15:8> in response to the first pipe input control signal PINB_B0<1:0>, and outputs the stored data as an upper preliminary output data IO_OUT<15:8> in response to a pipe output control signal POUTB<1:0>.

The second data latch unit 220 includes third and fourth pipe registers 222 and 224 that may be enabled in response to a second bank selection signal POUT_SEL_B1. The third pipe register 222 stores a second lower bank data GIO_B1<7:0> in response to a second pipe input control signal PINB_B1<1:0>, and outputs the stored data as a lower preliminary output data IO_OUT<7:0> in response to a pipe output control signal POUTB<1:0>. The fourth pipe register 224 stores a second upper bank data GIO_B1<15:8> in response to the second pipe input control signal PINB_B1<1:0>, and outputs the stored data as the upper preliminary output data IO_OUT<15:8> in response to the pipe output control signal POUTB<1:0>.

The data output unit 230 synchronizes the lower preliminary output data IO_OUT<7:0>, which are transferred from the first and second data latch units 210 and 212 with a rising edge of a first clock CLK_4D and outputs a rising output data DOUT_R<7:0>. The data output unit 230 also synchronizes the upper preliminary output data IO_OUT<15:8>, which are transferred from the first and second data latch units 210 and 220, with a rising edge of a second clock CLK_3B, and outputs a falling output data DOUT_F<7:0>. The data output unit 230 includes first and second flip-flops 232 and 234. The first flip-flop 232 synchronizes the lower preliminary output data IO_OUT<7:0> with the rising edge of the first clock CLK_4D and outputs the rising output data DOUT_R<7:0>. The second flip-flop 234 synchronizes the upper preliminary output data IO_OUT<15:8> with the rising edge of the second clock CLK_3B and outputs the falling output data DOUT_F<7:0>.

The first clock CLK_4D and the second clock CLK_3B may be internal clock signals that are generated based on a read enable signal RE (not shown) toggling during a read operation. The first clock CLK_4D may be a clock signal that is transferred as the read enable signal RE passes through 4-stage logic gates (e.g., inverters), whereas the second clock CLK_3B may be a clock signal that is transferred as the read enable signal RE passes through 3-stage logic gates (e.g., inverters).

Hereafter, the configurations of the first to fourth pipe registers 212, 214, 222 and 224 are described with reference to FIG. 3. Since the first to fourth pipe registers 212, 214, 222 and 224 have substantially the same configuration, the configuration of the first pipe register 212 will be described representatively.

Figure 3:
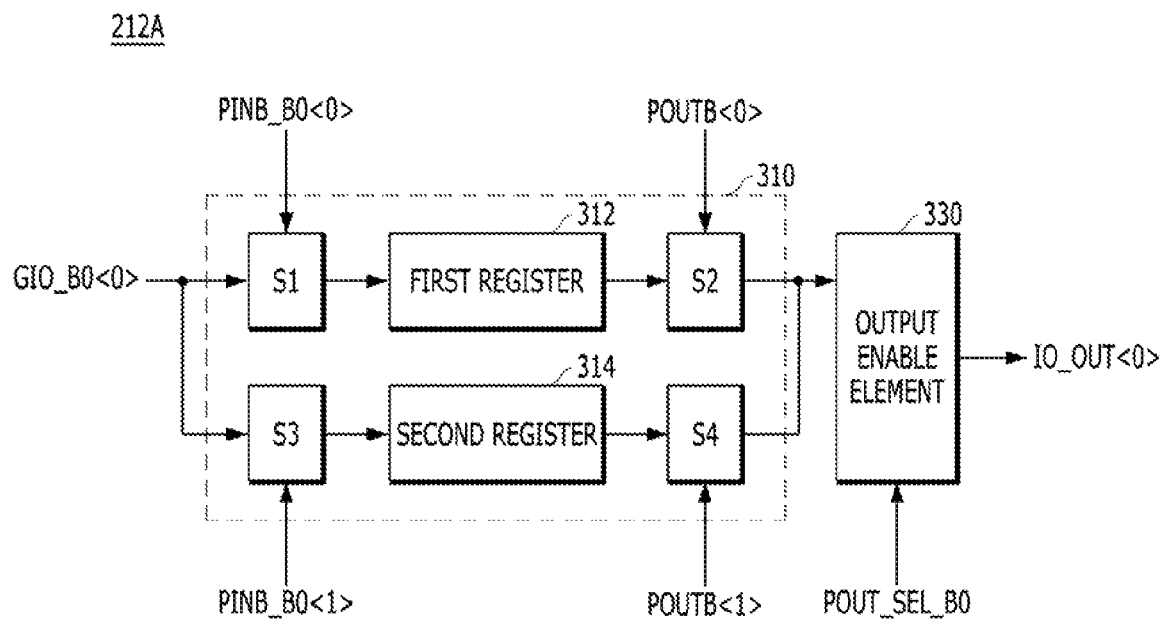
FIG. 3 is a block diagram illustrating a portion of a first pipe register shown in FIG. 2.

FIG. 3 is a block diagram illustrating a portion 212A of the first pipe register 212 shown in FIG. 2. FIG. 3 mainly shows a unit pipe register 212A that receives one bank data GIO_B0<0> transferred through one global input/output (GIO) line and outputs a corresponding preliminary output data IO_OUT<0> among the constituent elements of the first pipe register 212.

Referring to FIG. 3, the unit pipe register 212A includes a storage element 310 and an output enable element 330.

The storage element 310 includes first and second input switches S1 and S3, first and second output switches S2 and S4, and first and second registers 312 and 314 for temporarily storing the bank data GIO_B0<0> that is transferred through the global input/output line GIO. The storage element 310 may perform a data loading operation twice and then perform an operation of outputting the data sequentially by using the two registers 312 and 314.

The first and second input switches S1 and S3 provide a path through which the bank data GIO_B0<0> transferred through the global input/output (GIO) line is sequentially inputted to the first and second registers 312 and 314, respectively. The first and second output switches S2 and S4 provide a path through which the data stored in the first and second registers 312 and 314 is sequentially transferred to the output enable element 330. Each of the first and second input switches S1 and S3 is turned on in response to each bit of the first pipe input control signal PINB_B0<1:0>. Each of the first and second output switches S2 and S4 is turned on in response to each bit of the pipe output control signal POUTB<1:0>.

The output enable element 330 outputs the data transferred from the first register 312 or the second register 314 in response to the first bank selection signal POUT_SEL_B0 as the preliminary output data IO_OUT<0>.

Hereafter, the data output operation of the data output circuit 200 is described with reference to FIGS. 2 to 4.

Figure 4:
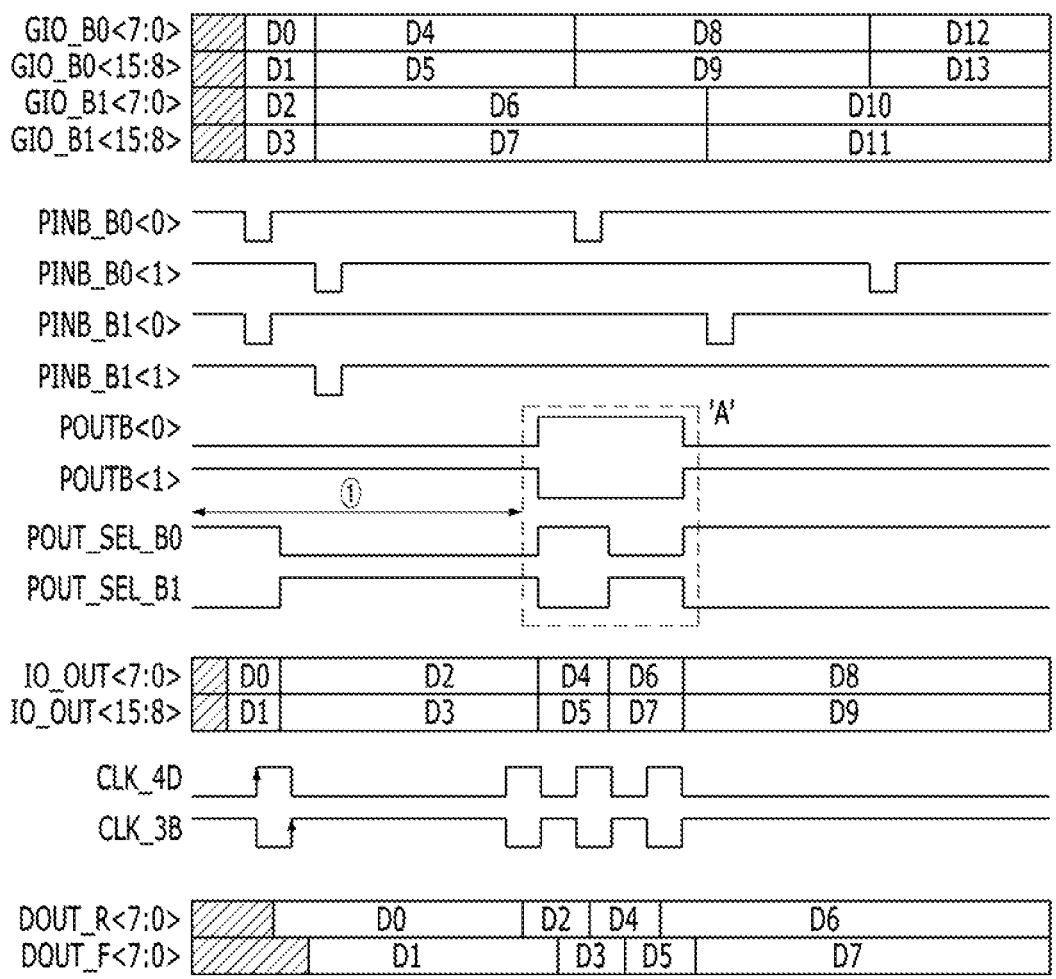
FIG. 4 is a timing diagram illustrating a data output operation of the data output circuit shown in FIG. 2.

FIG. 4 is a timing diagram illustrating a data output operation of the data output circuit 200 shown in FIG. 2.

Referring to FIG. 4, first, the first lower bank data GIO_B0<7:0> and the first upper bank data GIO_B0<15:8> are transferred from the first bank B0 to the first data latch unit 210, and the second lower bank data GIO_B1<7:0> and the second upper bank data GIO_B1<15:8> are transferred from the second bank B1 to the second data latch unit 220.

In response to a first bit PINB_B0<0> of the first pipe input control signal PINB_B0<1:0> that is enabled to a low level logic, the first pipe register 212 and the second pipe register 214 of the first data latch unit 210 store the first lower bank data GIO_B0<7:0>, which is 'D0', and the first upper bank data GIO_B0<15:8>, which is 'D1', in their first registers 312. Likewise, the third pipe register 222 and the fourth pipe register 224 of the second data latch unit 220 store the second lower bank data GIO_B1<7:0>, which is 'D2', and the second upper bank data GIO_B1<15:8>, which is 'D3', in their first registers 312 in response to a first bit PINB_B1<0> of the second pipe input control signal PINB_B1<1:0>.

Herein, in response to a first bit POUTB<0> of the pipe output control signal POUTB<1:0> that is enabled to a low level logic and the first bank selection signal POUT_SEL_B0 that is enabled to a high level logic, the first pipe register 212 and the second pipe register 214 output the first lower bank data GIO_B0<7:0>, which is 'D0', and the first upper bank data GIO_B0<15:8>, which is 'D1', that are stored in their first registers 312 as the lower preliminary output data IO_OUT<7:0> and the upper preliminary output data IO_OUT<15:8>, respectively. The data output unit 230 synchronizes the lower preliminary output data IO_OUT<7:0> with the rising edge of the first clock CLK_4D and outputs the rising output data DOUT_R<7:0>, and synchronizes the upper preliminary output data IO_OUT<15:8> with the rising edge of the second clock CLK_3B and outputs the falling output data DOUT_F<7:0>. Subsequently, when the second bank selection signal POUT_SEL_B1 is enabled to a high level logic while the first bit POUTB<0> of the pipe output control signal POUTB<1:0> is enabled to a low level logic, the third pipe register 222 and the fourth pipe register 224 output the second lower bank data GIO_B1<7:0>, which is 'D2', and the second upper bank data GIO_B1<15:8>, which is 'D3', that are stored in their first registers 312 as the lower preliminary output data IO_OUT<7:0> and the upper preliminary output data IO_OUT<15:8>, respectively.

During the data output operation (①), when a second bit PINB_B0<1> of the first pipe input control signal PINB_B0<1:0> and a second bit PINB_B1<1> of the second pipe input control signal PINB_B1<1:0> are sequentially enabled, the first pipe register 212 and the second pipe register 214 store the first lower bank data GIO_B0<7:0>, which is 'D4', and the first upper bank data GIO_B0<15:8>, which is 'D5', in their second registers 314, respectively, and the third pipe register 222 and the fourth pipe register 224 store the second lower bank data GIO_B1<7:0>, which is 'D6', and the second upper bank data GIO_B1<15:8>, which is 'D7', in their second registers 314, respectively.

After the data output operation (①) is finished, in response to a second bit POUTB<1> of the pipe output control signal POUTB<1:0> that is enabled to a low level logic and the first bank selection signal POUT_SEL_B0 that is enabled to a high level logic, the first pipe register 212 and the second pipe register 214 output the first lower bank data GIO_B0<7:0>, which is 'D4', and the first upper bank data GIO_B0<15:8>, which is 'D5', that are stored in their second registers 314 as the lower preliminary output data IO_OUT<7:0> and the upper preliminary output data IO_OUT<15:8>, respectively. The data output unit 230 synchronizes the lower preliminary output data IO_OUT<7:0> and the upper preliminary output data IO_OUT<15:8> with the rising edge of the first clock CLK_4D and the rising edge of the second clock CLK_3B and outputs the rising output data DOUT_R<7:0> and the falling output data DOUT_F<7:0>, respectively. Subsequently, when the second bank selection signal POUT_SEL_B1 is enabled to a high level logic while the second bit POUTB<1> of the pipe output control signal POUTB<1:0> is enabled to a low level logic, the third pipe register 222 and the fourth pipe register 224 output the second lower bank data GIO_B1<7:0>, which is 'D6', and the second upper bank data GIO_B1<15:8>, which is 'D7', that are stored in the second registers 314 as the lower preliminary output data IO_OUT<7:0> and the upper preliminary output data IO_OUT<15:8>, respectively.

According to the data output operation described above, the next data may be loaded while the data output operation (①) is performed. Therefore, data may be transferred at a higher speed. However, since the first bank selection signal POUT_SEL_B0 and the second bank selection signal POUT_SEL_B1 for determining an output timing of the pipe registers shift substantially at the same timing, the width of a valid data window is reduced according to the shifting timing of the signals.

Figure 5A:
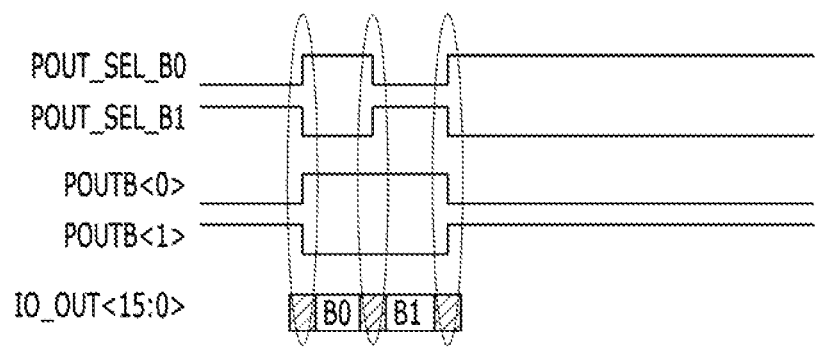
FIG. 5A is a timing diagram illustrating a timing margin of the data output operation of the data output circuit shown in FIG. 2.

FIG. 5A is a timing diagram illustrating a timing margin of the data output operation of the data output circuit 200 shown in FIG. 2. FIG. 5A shows the signals corresponding to the 'A' portion of FIG. 4.

As shown in FIG. 5A, in the data output operation performed in the data output circuit 200 shown in FIG. 2, when even a slight mismatching occurs in the shifting timing between the pipe output control signal POUTB<1:0> and the first and second bank selection signals POUT_SEL_B0 and POUT_SEL_B1, the width of the valid window of the preliminary output data IO_OUT<15:0> is reduced. The reduced width of the valid window shrinks the set-up/hold margin of the first and second flip-flops 232 and 234 of the data output unit 230, thus limiting the high-speed data output operation.

Figure 5B:
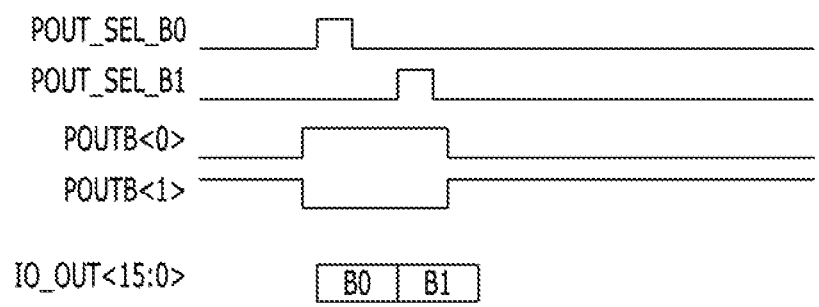
FIG. 5B is a timing diagram illustrating a data output margin of a data output operation, according to an embodiment of the present invention.

FIG. 5B is a timing diagram illustrating a data output margin of a data output operation, according to an embodiment an embodiment of the present invention.

Referring to FIG. 5B, the bank selection signals POUT_SEL_B0 and POUT_SEL_B1 are generated as pulse-type signals reflecting clock information in the embodiment of the present invention. Therefore, the valid window of the preliminary output data IO_OUT<15:0> may be secured as long as the shifting timing of the bank selection signals POUT_SEL_B0 and POUT_SEL_B1 is within the enabling duration of the pipe output control signal POUTB<1:0>.

Hereafter, the configurations of the embodiment of the present invention are described in detail with reference to the drawings.

Figure 6:
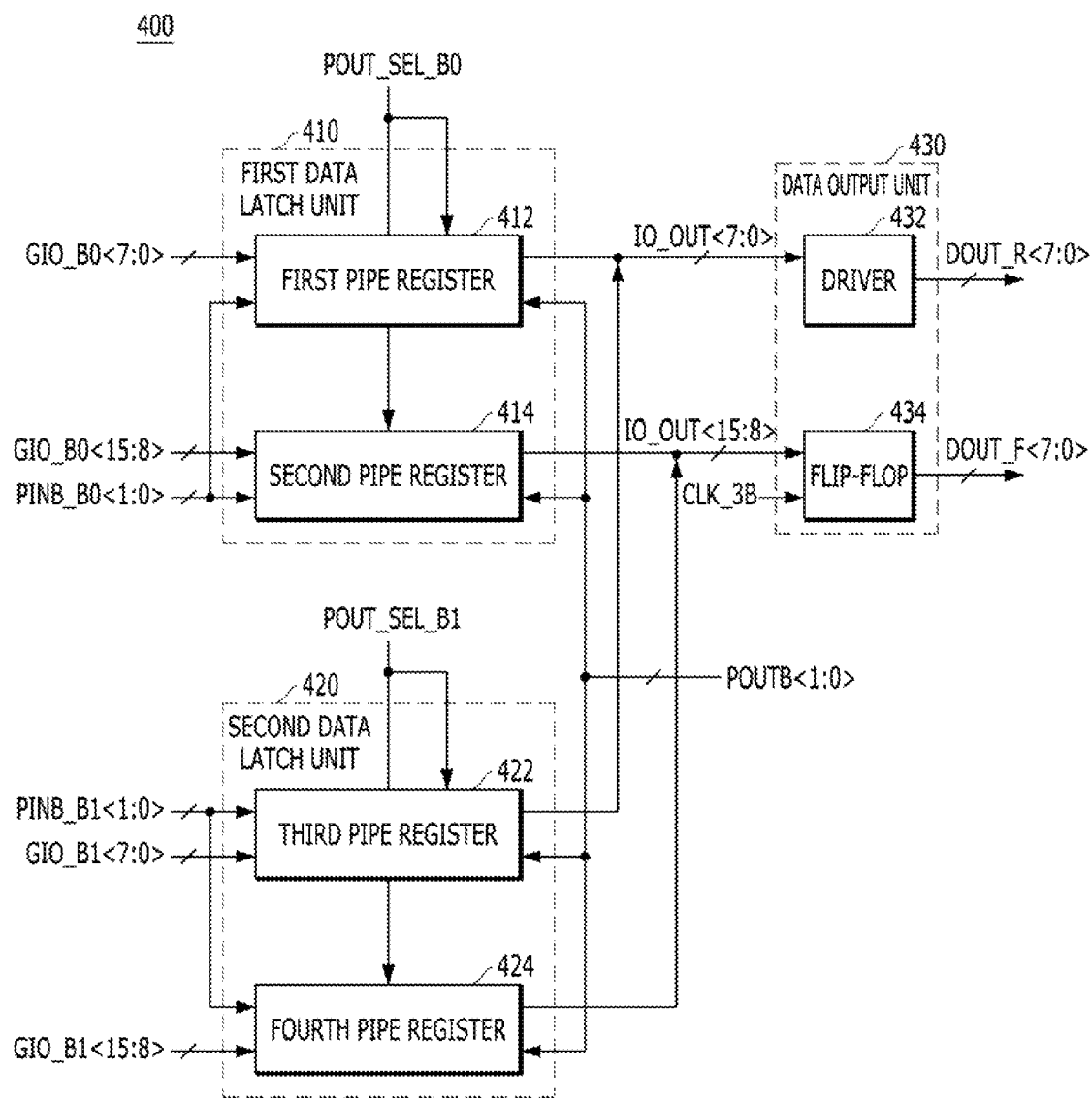
FIG. 6 is a block diagram illustrating a data output circuit, according to an embodiment of the present invention.

FIG. 6 is a block diagram illustrating a data output circuit 400, according to an embodiment of the present invention.

Referring to FIG. 6, the data output circuit 400 may include a first data latch unit 410, a second data latch unit 420, and a data output unit 430.

The first data latch unit 410 may be enabled in response to a first bank selection signal POUT_SEL_B0 reflecting information of the first clock CLK_4D (shown in FIG. 2). The first data latch unit 410 may store a first lower bank data GIO_B0<7:0> and a first upper bank data GIO_B0<15:8> that are transferred from a first bank B0 (see FIG. 1) in response to a first pipe input control signal PINB_B0<1:0>, and output a lower preliminary output data IO_OUT<7:0> and an upper preliminary output data IO_OUT<15:8> in response to a pipe output control signal POUTB<1:0>.

The second data latch unit 420 may be enabled in response to a second bank selection signal POUT_SEL_B1 reflecting information of the first clock CLK_4D. The second data latch unit 420 may store a second lower bank data GIO_B1<7:0> and a second upper bank data GIO_B1<15:8> that are transferred from a second bank B1 (see FIG. 1) in response to a second pipe input control signal PINB_B1<1:0>, and output the lower preliminary output data IO_OUT<7:0> and the upper preliminary output data IO_OUT<15:8> in response to the pipe output control signal POUTB<1:0>.

The data output unit 430 may drive the lower preliminary output data IO_OUT<7:0> that is transferred from the first data latch unit 410 or the second data latch unit 420 and output a rising output data DOUT_R<7:0>. Further, the data output unit 430 may synchronize the upper preliminary output data IO_OUT<15:8> with a rising edge of a second clock CLK_3B and output a falling output data DOUT_F<7:0>. Herein, the first clock CLK_4D and the second clock CLK_3B are internal clock signals that are generated based on a read enable signal RE (not shown) that toggles during a read operation. The first clock CLK_4D may be a clock signal that is transferred as the read enable signal RE passes through 4-stage logic gates (e.g., inverters), whereas the second clock CLK_3B may be a clock signal that is transferred as the read enable signal RE passes through 3-stage logic gates (e.g., inverters). Therefore, the first clock CLK_4D and the second clock CLK_3B may be substantially the same clock signals having opposite phases to each other.

To be more specific, the first data latch unit 410 may include a first pipe register 412 and a second pipe register 414 that are enabled in response to the first bank selection signal POUT_SEL_B0. The first pipe register 412 may store the first lower bank data GIO_B0<7:0> transferred from the first bank B0 in response to the first pipe input control signal PINB_B0<1:0>, and output the stored data as the lower preliminary output data IO_OUT<7:0> in response to the pipe output control signal POUTB<1:0>. The second pipe register 414 may store the first upper bank data GIO_B0<15:8> transferred from the first bank B0 in response to the first pipe input control signal PINB_B0<1:0>, and output the stored data as the upper preliminary output data IO_OUT<15:8> in response to the pipe output control signal POUTB<1:0>.

Likewise, the second data latch unit 420 may include third and fourth pipe registers 422 and 424 that are enabled in response to the second bank selection signal POUT_SEL_B1. The third pipe register 422 may store the second lower bank data GIO_B1<7:0> transferred from the second bank B1 in response to the second pipe input control signal PINB_B1<1:0>, and output the stored data as the lower preliminary output data IO_OUT<7:0> in response to the pipe output control signal POUTB<1:0>. The fourth pipe register 424 may store the second upper bank data GIO_B1<15:8> transferred from the second bank B1 in response to the second pipe input control signal PINB_B1<1:0>, and output the stored data as the upper preliminary output data IO_OUT<15:8> in response to the pipe output control signal POUTB<1:0>.

The data output unit 430 may include a driver 432 and a flip-flop 434. The driver 432 may drive the lower preliminary output data IO_OUT<7:0> transferred from the first data latch unit 410 or the second data latch unit 420 and output the rising output data DOUT_R<7:0>. The flip-flop 434 may synchronize the upper preliminary output data IO_OUT<15:8> transferred from the first data latch unit 410 or the second data latch unit 420 with a rising edge of the second clock CLK_3B and output the falling output data DOUT_F<7:0>. In this embodiment of the present invention, the flip-flop 434 may be formed of D flip-flops that receive the second clock CLK_3B at a clock terminal, receive each bit of the upper preliminary output data IO_OUT<15:8> at an input terminal, and output the falling output data DOUT_F<7:0> at an output terminal.

In the embodiment of the present invention described above, since the first and second bank selection signals POUT_SEL_B0 and POUT_SEL_B1 are generated as pulse-type signals reflecting information of the first clock CLK_4D, the valid window of the preliminary output data IO_OUT<15:8> may be secured as long as the shifting timing of the bank selection signals POUT_SEL_B0 and POUT_SEL_B1 is within the enabling duration of the pipe output control signal POUTB<1:0>. Also, whereas the data output unit 230 of FIG. 2 requires both of the first clock CLK_4D and the second clock CLK_3B to respectively latch the lower preliminary output data IO_OUT<7:0> and the upper preliminary output data IO_OUT<15:8>, the data output unit 430 of FIG. 6 does not have to receive the first clock CLK_4D to latch the lower preliminary output data IO_OUT<7:0>, because the information of the first clock CLK_4D is already reflected into the first bank selection signal POUT_SEL_B0 and the second bank selection signal POUT_SEL_B1. In short, as a flip-flop 232 of FIG. 2 for latching the lower preliminary output data IO_OUT<7:0> is replaced with the driver 432 of FIG. 4 that includes an inverter, the number of control signals is decreased, hence, also reducing the chip size and operation current.

Meanwhile, the internal configurations of the first to fourth pipe registers 412, 414, 422 and 424 are substantially the same as the configuration described with reference to FIG. 3. If there is any difference, the bank selection signals POUT_SEL_B0 and POUT_SEL_B1 applied to the first to fourth pipe registers 412, 414, 422 and 424 are pulse-type signals reflecting the information of the first clock CLK_4D. Hereafter, the configurations of the first to fourth pipe registers 412, 414, 422 and 424 are described with reference to FIG. 7. Since the configurations of the first to fourth pipe registers 412, 414, 422 and 424 are substantially the same, the configuration of the first pipe register 412 is described herein representatively.

Figure 7:
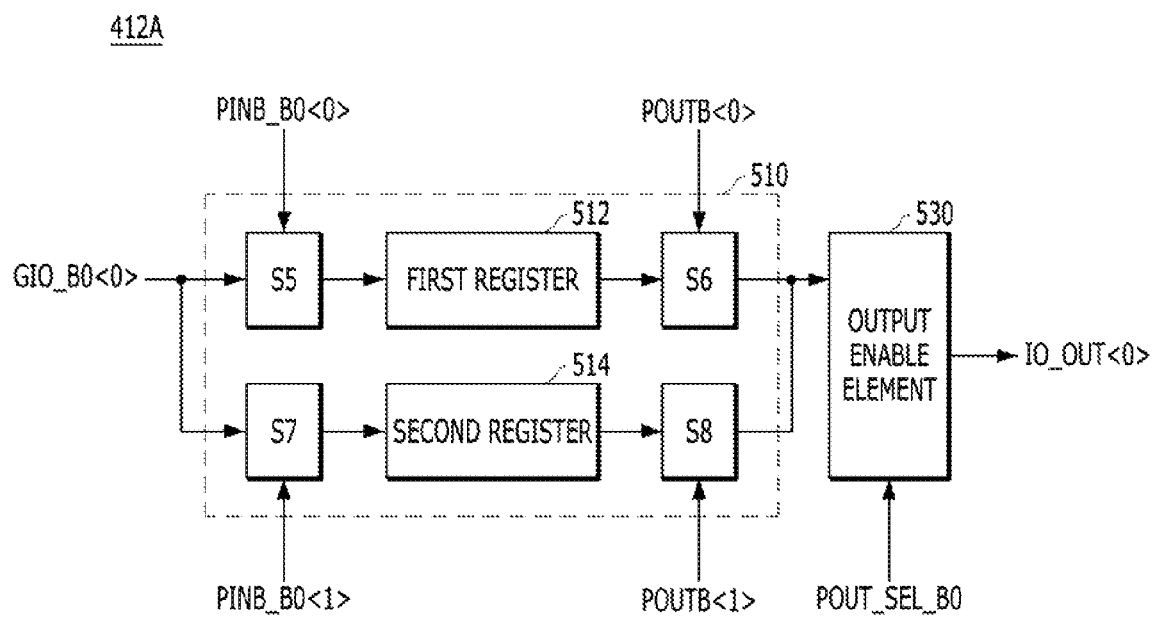
FIG. 7 is a block diagram illustrating a portion of a first pipe register shown in FIG. 6.

FIG. 7 is a block diagram illustrating a portion 412A of the first pipe register 412 shown in FIG. 6. FIG. 7 mainly shows a unit pipe register 412A that receives one bank data GIO_B0<0> transferred through one global input/output (GIO) line and outputs a corresponding preliminary output data IO_OUT<0> among the constituent elements of the first pipe register 412.

Referring to FIG. 7, the unit pipe register 412A may include a storage element 510 and an output enable element 530.

The storage element 510 includes first and second input switches S5 and S7, first and second output switches S6 and S8, and first and second registers 512 and 514 for temporarily storing the bank data GIO_B0<0> that is transferred through the global input/output (GIO) line. The storage element 510 may perform a data loading operation twice and then perform an operation of outputting the data sequentially by using the two registers 512 and 514. Although FIG. 7 shows only two registers included in the storage element 510 of the unit pipe register 412A, the scope of the present invention is not limited to this configuration. For example, the storage element 510 of the unit pipe register 412A may include three or more registers. For example, the storage element 510 of the unit pipe register 412A may include first to eighth registers, and there may be 8-bit pipe input control signals PINB_B0<7:0> and PINB_B1<7:0> and an 8-bit pipe output control signal POUTB<7:0> to control the first to eighth registers. In this example, the data loading operation may be performed 8 times. Then the loaded data may be outputted sequentially.

The first and second input switches S5 and S7 may provide a path through which the bank data GIO_B0<0> transferred through the global input/output (GIO) line is sequentially inputted to the first and second registers 512 and 514. The first and second output switches S6 and S8 may provide a path through which the data inputted to the first and second registers 512 and 514 is sequentially transferred to the output enable element 530. Each of the first and second input switches S5 and S7 is turned on in response to each bit of the first pipe input control signal PINB_B0<1:0>. Each of first and second output switches S6 and S8 is turned on in response to each bit of the pipe output control signal POUTB<1:0>.

The output enable element 530 may output the data transferred from the first register 512 or the second register 514 in response to the first bank selection signal POUT_SEL_B0 as the preliminary output data IO_OUT<0>.

Figure 8:
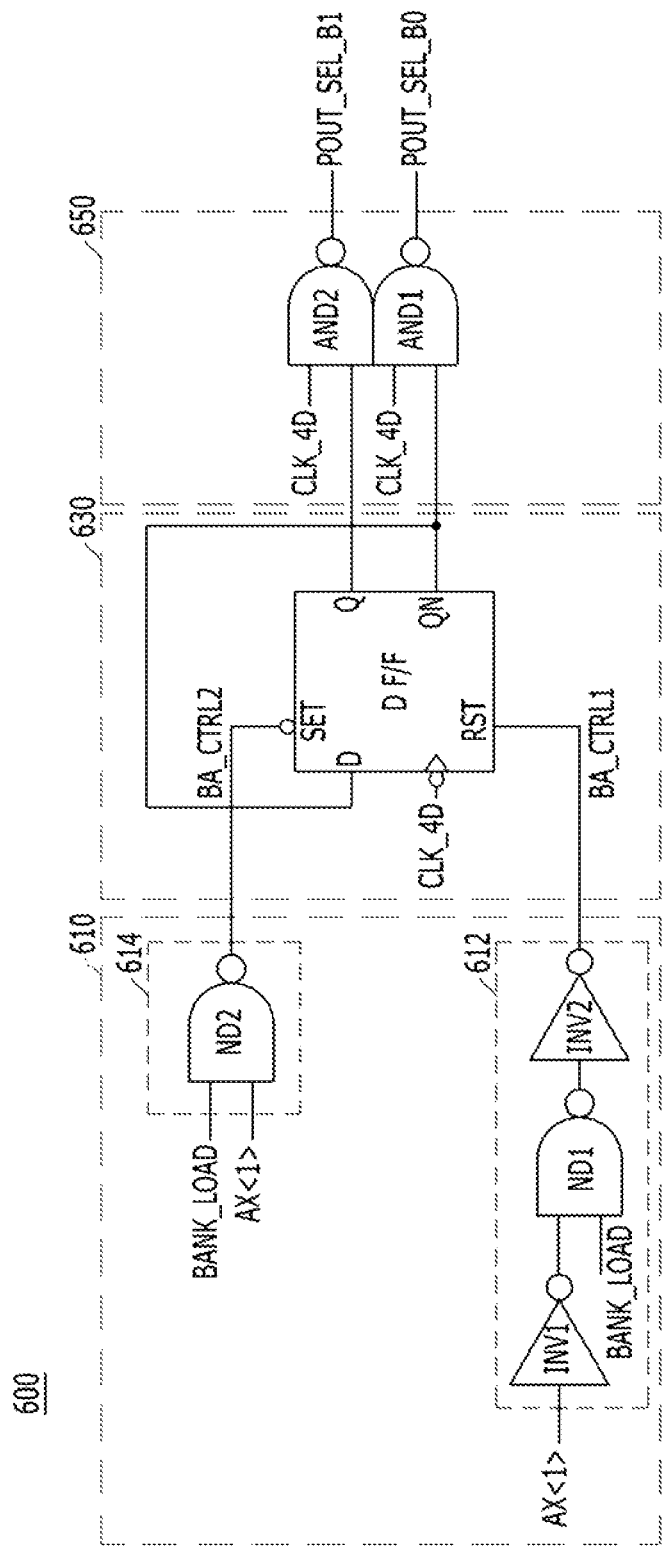
FIG. 8 is a circuit diagram illustrating an output selection signal generation circuit, according to an embodiment of the present invention.

FIG. 8 is a circuit diagram illustrating an output selection signal generation circuit 600, according to an embodiment of the present invention.

Referring to FIG. 8, the output selection signal generation circuit 600 may include an initialization unit 610, a flip-flop unit 630, and a clock information reflecting unit 650.

The initialization unit 610 may generate a first bank control signal BA_CTRL1 and a second bank control signal BA_CTRL2 based on a bank address signal AX<1> and a bank address strobe signal BANK_LOAD. Herein, the bank address strobe signal BANK_LOAD is a signal enabled when the bank address signal AX<1> is inputted from an external device such as a host. The bank address strobe signal BANK_LOAD is a signal for selecting a signal between the first and second bank control signals BA_CTRL1 and BA_CTRL2 to be enabled. The flip-flop unit 630 may receive an inverted signal of the first clock CLK_4D at a clock terminal, the first bank control signal BA_CTRL1 at a reset terminal RST, an inverted signal of the second bank control signal BA_CTRL2 at a set terminal SET, and a signal of its inverted output terminal QN at an input terminal D. In some embodiments, the flip-flop unit 630 may be formed of a D flip-flop (F/F). The clock information reflecting unit 650 may generate the first bank selection signal POUT_SEL_B0 and the second bank selection signal POUT_SEL_B1 by reflecting the information of the first clock CLK_4D into the signal of the inverted output terminal QN of the flip-flop unit 630 and the signal of an output terminal Q of the flip-flop unit 630.

To be more specific, the initialization unit 610 may include a first control signal generator 612 and a second control signal generator 614. The first control signal generator 612 generates the first bank control signal BA_CTRL1 that is enabled in response to the bank address strobe signal BANK_LOAD when the bank address signal AX<1> representing the first bank B0 is inputted. The second control signal generator 614 generates the second bank control signal BA_CTRL2 that is enabled in response to the bank address strobe signal BANK_LOAD when the bank address signal AX<1> representing the second bank B1 is inputted.

The first control signal generator 612 may include a first inverter INV1 which inverts the bank address signal AX<1>, a first NAND gate ND1 which performs an NAND operation on the inversion of the bank address signal AX<1> by the first inverter INV1 and the bank address strobe signal BANK_LOAD, and a second inverter INV2 which inverts the output of the first NAND gate ND1. In other words, the first control signal generator 612 may perform an AND operation on the output of the first inverter INV1 and the bank address strobe signal BANK_LOAD and outputs the first bank control signal BA_CTRL1. The second control signal generator 614 may include a second NAND gate ND2 which receives the bank address signal AX<1> and the bank address strobe signal BANK_LOAD, performs an NAND operation on the bank address signal AX<1> and the bank address strobe signal BANK_LOAD, and outputs the second bank control signal BA_CTRL2.

Figures 9A, 9B:
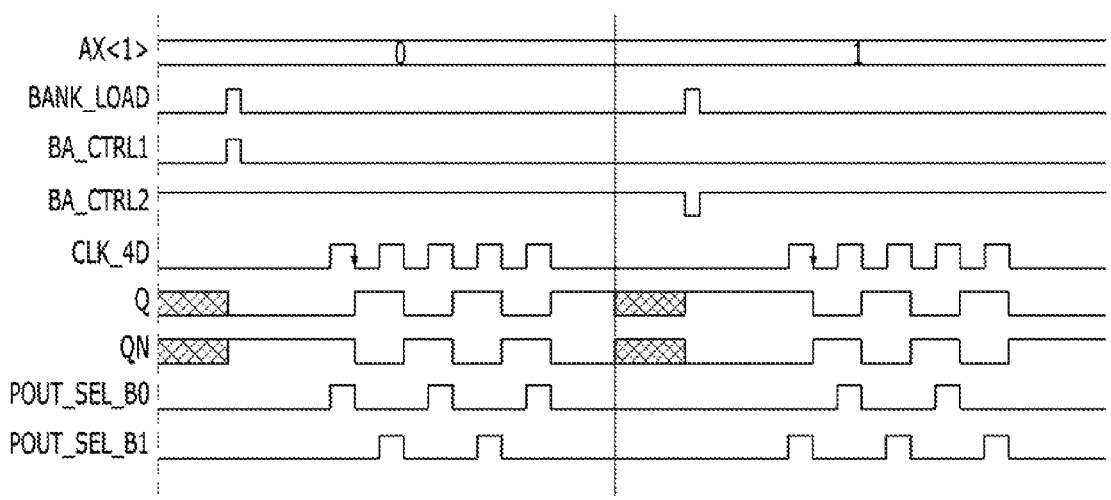
FIG. 9A is a truth table illustrating an operation of an initialization unit shown in FIG. 8.
FIG. 9B is a timing diagram illustrating an operation of the output selection signal generation circuit shown in FIG. 8.

FIG. 9A is a truth table illustrating an operation of an initialization unit 610 shown in FIG. 8.

Referring to FIG. 9A, the first control signal generator 612 may generate the first bank control signal BA_CTRL1 that is enabled in response to the bank address strobe signal BANK_LOAD, when the bank address signal AX<1> is inputted as a value of '0' that represents the first bank B0. The second control signal generator 614 may generate the second bank control signal BA_CTRL2 that is enabled in response to the bank address strobe signal BANK_LOAD, when the bank address signal AX<1> is inputted as a value of '1' that represents the first bank B1.

Referring back to FIG. 8, the clock information reflecting unit 650 may include a first AND gate AND1 and a second AND gate AND2. The first AND gate AND1 performs an AND operation on the signal of the inverted output terminal QN of the flip-flop unit 630 and the first clock CLK_4D and outputs the first bank selection signal POUT_SEL_B0. The second AND gate AND2 performs an AND operation on the signal of the output terminal Q of the flip-flop unit 630 and the first clock CLK_4D and outputs the second bank selection signal POUT_SEL_B1.

Meanwhile, the output selection signal generation circuit 600 may be included in the configuration of the control logic 160 shown in FIG. 1. In other words, the control logic 160 may generate the first pipe input control signal PINB_B0<1:0>, the second pipe input control signal PINB_B1<1:0>, and the pipe output control signal POUTB<1:0>, which are signals for the data output operation, and generate the first bank selection signal POUT_SEL_B0 and the second bank selection signal POUT_SEL_B1 by reflecting the information of the first clock CLK_4D.

Hereafter, the operation of the output selection signal generation circuit 600 is described with reference to FIGS. 8 to 9B.

FIG. 9B is a timing diagram illustrating an operation of the output selection signal generation circuit 600 shown in FIG. 8.

Referring to FIG. 9B, first, when the bank address signal AX<1> is inputted as a value of '0' that represents the first bank B0, the initialization unit 610 generates the first bank control signal BA_CTRL1 that is enabled in response to the bank address strobe signal BANK_LOAD. Herein, the second bank control signal BA_CTRL2 remains at a high level logic. The flip-flop unit 630 is reset in response to the enabling of the first bank control signal BA_CTRL1 and initializes the signal of the output terminal Q to a low level logic and the signal of the inverted output terminal QN to a high level logic. Herein, the clock information reflecting unit 650 may reflect the information of the first clock CLK_4D into the initial value (which is of a high level logic) of the signal of the inverted output terminal QN and generate the first bank selection signal POUT_SEL_B0 first that is enabled to a high level logic.

Subsequently, the flip-flop unit 630 latches the signal of its inverted output terminal QN in synchronization with a falling edge of the first clock CLK_4D and outputs the latched signal as the signal of the output terminal Q. In consequences, the flip-flop unit 630 may output the signals that toggle in synchronization with the falling edge of the first clock CLK_4D to the output terminal Q and the inverted output terminal QN. The clock information reflecting unit 650 may reflect the information of the first clock CLK_4D into the signals of the output terminal Q and the inverted output terminal QN of the flip-flop unit 630 and generate the first bank selection signal POUT_SEL_B0 and the second bank selection signal POUT_SEL_B1.

Subsequently, when the bank address signal AX<1> is inputted as a value of '1' that represents the second bank B1, the second control signal generator 614 generates the second bank control signal BA_CTRL2 that is enabled in response to the bank address strobe signal BANK_LOAD. Herein, the first bank control signal BA_CTRL1 remains at a low level logic. The flip-flop unit 630 is set in response to the enabling of the second bank control signal BA_CTRL2 and initializes the signal of the output terminal Q to a high level logic and the signal of the inverted output terminal QN to a low level logic. Herein, the clock information reflecting unit 650 may reflect the information of the first clock CLK_4D into the initial value (which is of a high level logic) of the signal of the output terminal Q and generate the second bank selection signal POUT_SEL_B1 first that is enabled to a high level logic.

Subsequently, the flip-flop unit 630 latches the signal of its inverted output terminal QN in synchronization with the falling edge of the first clock CLK_4D and outputs the latched signal as the signal of the output terminal Q. In consequences, the flip-flop unit 630 may output the signals that toggle in synchronization with the falling edge of the first clock CLK_4D to the output terminal Q and the inverted output terminal QN. The clock information reflecting unit 650 may reflect the information of the first clock CLK_4D into the signals of the output terminal Q and the inverted output terminal QN of the flip-flop unit 630 and generate the first bank selection signal POUT_SEL_B0 and the second bank selection signal POUT_SEL_B1.

The typical output selection signal generation circuit generates the first bank selection signal POUT_SEL_B0 and the second bank selection signal POUT_SEL_B1 simply according to the value of the bank address signal AX<1>. However, the output selection signal generation circuit 600 according to an embodiment the embodiment of the present invention may generate the first bank selection signal POUT_ SEL_B0 and the second bank selection signal POUT_ SEL_B1 in a pulse type by reflecting the information of the first clock CLK_4D into the bank address signal AX<1>.

Hereafter, the data output operation of the data output circuit according to an embodiment an embodiment of the present invention is described with reference to FIGS. 6 to 10.

Figure 10:
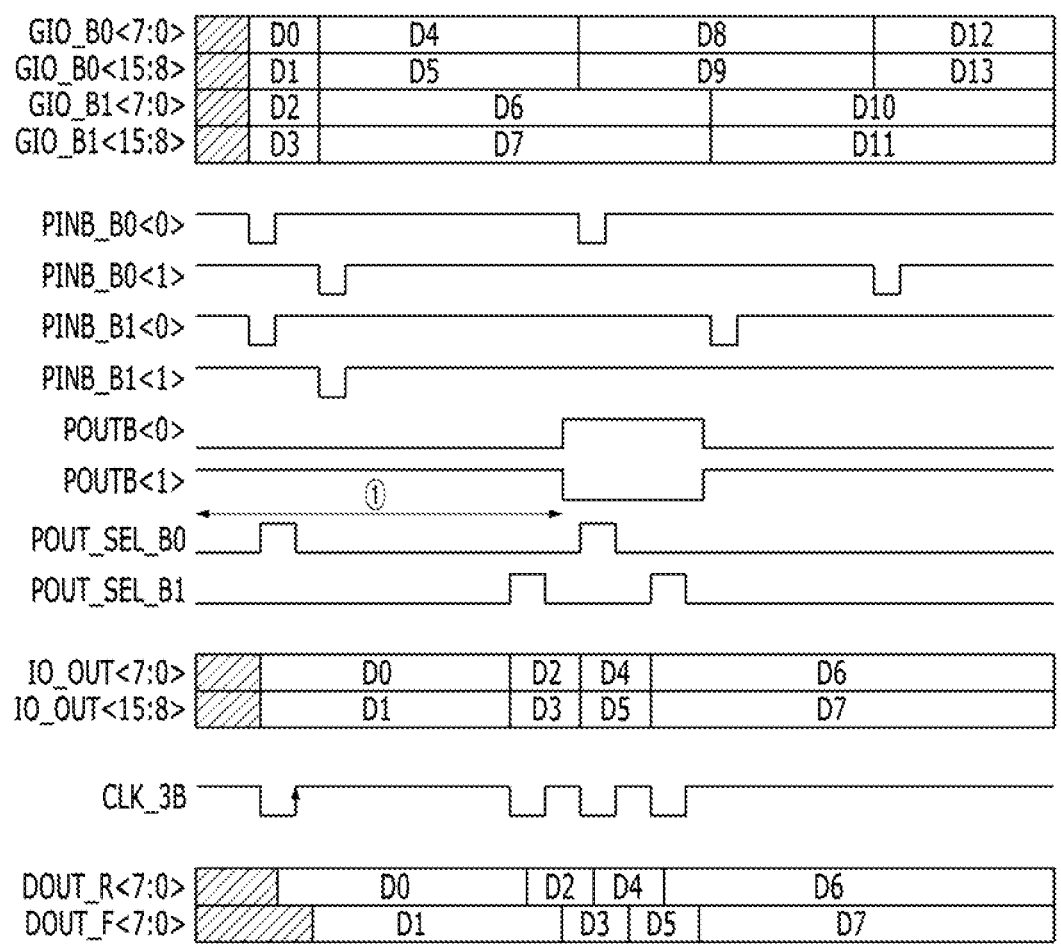
FIG. 10 is a timing diagram illustrating a data output operation of the data output circuit, according to an embodiment of the present invention.

FIG. 10 is a timing diagram illustrating a data output operation of the data output circuit 400 of FIG. 6 according to an embodiment an embodiment of the present invention.

Referring to FIG. 10, first, the first lower bank data GIO_B0<7:0> and the first upper bank data GIO_B0<15:8> are transferred from the first bank B0 to the first data latch unit 410, and the second lower bank data GIO_B1<7:0> and the second upper bank data GIO_B1<15:8> are transferred from the second bank B1 to the second data latch unit 420.

In response to a first bit PINB_B0<0> of the first pipe input control signal PINB_B0<1:0> that is enabled to a low level logic, the first pipe register 412 and the second pipe register 414 of the first data latch unit 410 store the first lower bank data GIO_B0<7:0>, which is 'D0', and the first upper bank data GIO_B0<15:8>, which is 'D1', in their first registers 512. Likewise, the third pipe register 422 and the fourth pipe register 424 of the second data latch unit 420 store the second lower bank data GIO_B1<7:0>, which is 'D2', and the second upper bank data GIO_B1<15:8>, which is 'D3', in their first registers 512 in response to a first bit PINB_B1<0> of the second pipe input control signal PINB_B1<1:0>.

Herein, when the first bank selection signal POUT_SEL_B0 reflecting the information of the first clock CLK_4D toggles to a high level logic while the first bit POUTB<0> of the pipe output control signal POUTB<1:0> is enabled to a low level logic, the first pipe register 412 and the second pipe register 414 output the first lower bank data GIO_B0<7:0>, which is 'D0', and the first upper bank data GIO_B0<15:8>, which is 'D1', that are stored in their first registers 512 as the lower preliminary output data IO_OUT<7:0> and the upper preliminary output data IO_OUT<15:8>, respectively. The driver 432 of the data output unit 430 drives the lower preliminary output data IO_OUT<7:0> and outputs the rising output data DOUT_R<7:0>. The flip-flop 434 of the data output unit 430 synchronizes the upper preliminary output data IO_OUT<15:8> with the rising edge of the second clock CLK_3B and outputs the falling output data DOUT_F<7:0>. Herein, the driver 432 may delay the lower preliminary output data IO_OUT<7:0> for a predetermined time and output the rising output data DOUT_R<7:0>. Subsequently, when the second bank selection signal POUT_SEL_B1 reflecting the information of the first clock CLK_4D toggles to a high level logic while the first bit POUTB<0> of the pipe output control signal POUTB<1:0> is enabled to a low level logic, the third pipe register 422 and the fourth pipe register 424 output the second lower bank data GIO_B1<7: 0>, which is 'D2', and the second upper bank data GIO_B1<15:8>, which is 'D3', that are stored in their first registers 512 as the lower preliminary output data IO_OUT<7:0> and the upper preliminary output data IO_OUT<15:8>, respectively.

During the data output operation (①), when a second bit PINB_B0<1> of the first pipe input control signal PINB_B0<1:0> and a second bit PINB_B1<1> of the second pipe input control signal PINB_B1<1:0> are sequentially enabled, the first pipe register 412 and the second pipe register 414 store the first lower bank data GIO_B0<7:0>, which is 'D4', and the first upper bank data GIO_B0<15:8>, which is 'D5', in their second registers 514, respectively, and the third pipe register 422 and the fourth pipe register 424 store the second lower bank data GIO_B1<7:0>, which is 'D6', and the second upper bank data GIO_B1<15:8>, which is 'D7', in their second registers 514, respectively.

After the data output operation (①) is finished, when the first bank selection signal POUT_SEL_B0 reflecting the information of the first clock CLK_4D toggles to a high level logic while a second bit POUTB<1> of the pipe output control signal POUTB<1:0> is enabled to a low level logic, the first pipe register 412 and the second pipe register 414 may output the first lower bank data GIO_B0<7:0>, which is 'D4', and the first upper bank data GIO_B0<15:8>, which is 'D5', that are stored in their second registers 514 as the lower preliminary output data IO_OUT<7:0> and the upper preliminary output data IO_OUT<15:8>, respectively. The driver 432 of the data output unit 430 drives the lower preliminary output data IO_OUT<7:0> and outputs the rising output data DOUT_R<7:0>. The flip-flop 434 of the data output unit 430 synchronizes the upper preliminary output data IO_OUT<15:8> with the rising edge of the second clock CLK_3B and outputs the falling output data DOUT_F<7:0>. Subsequently, when the second bank selection signal POUT_SEL_B1 reflecting the information of the first clock CLK_4D toggles to a high level logic while the second bit POUTB<1> of the pipe output control signal POUTB<1:0> is enabled to a low level logic, the third pipe register 422 and the fourth pipe register 424 output the second lower bank data GIO_B1<7:0>, which is 'D6', and the second upper bank data GIO_B1<15:8>, which is 'D7', that are stored in the second registers 514 as the lower preliminary output data IO_OUT<7:0> and the upper preliminary output data IO_OUT<15:8>, respectively.

The data output operation according to an embodiment the embodiment of the present invention described above not only makes it possible to get the next data be loaded while the data output operation (①) is performed and thereby output data at a higher speed, but also to secure the valid data window of the output signals IO_OUT<15:0> of the pipe registers and improve the margin between the data and the control signals, which also contributes the improvement in the data output rate.

According to embodiments of the present invention, a semiconductor memory device may increase the operation speed by increasing the timing margin between a signal for controlling the operation of a pipe register and the output data, when it performs a data output operation.

Also, the semiconductor memory device according to embodiments of the present invention can have a decreased chip size and employ fewer control signals and less current to operate by using at least one driver instead of a flip-flop since unlike a flip-flop a driver doesn't require a clock to perform a data output operation.

While the present invention has been described with respect to the specific embodiments, it will be apparent to those skilled in the art that various changes and modifications may be made without departing from the spirit and scope of the invention as defined in the following claims.

What is claimed is:

1. A data output circuit comprising:
   a first data latch unit that is enabled in response to a first bank selection signal including information of a clock, suitable for storing a first lower bank data and a first upper bank data in response to a first input control signal, and suitable for outputting the stored first lower and upper bank data as a lower preliminary output data and an upper preliminary output data in response to an output control signal;
   a second data latch unit that is enabled in response to a second bank selection signal including the information of the clock, suitable for storing a second lower bank data and a second upper bank data in response to a second input control signal, and suitable for outputting the stored second lower and upper bank data as the lower preliminary output data and the upper preliminary output data in response to the output control signal;
   a data output unit suitable for driving the lower preliminary output data to send a first output data while synchronizing the upper preliminary output data with the clock to send a second output data; and
   a signal generation block suitable for generating the first bank selection signal and the second bank selection signal including the information of the clock,
   wherein the signal generation block includes:
      an initialization unit suitable for generating a first bank control signal and a second bank control signal based on a bank address signal and a bank address strobe signal;
      a flip-flop unit suitable for receiving the clock at a clock terminal, the first bank control signal at a reset terminal, an inverted signal of the second bank control signal at a set terminal, and an inverted output signal of the flip-flop unit at an input terminal; and
      a clock information reflecting unit suitable for generating the first bank selection signal and the second bank selection signal by reflecting the information of the clock into the inverted output signal and the output signal of the flip-flop unit.

2. The data output circuit of claim 1, wherein each of the first data latch unit and the second data latch unit includes:
   a first pipe register suitable for storing a lower bank data received from each of first and second banks in response to a corresponding input control signal, and for outputting the stored lower bank data as the lower preliminary output data in response to the output control signal; and
   a second pipe register suitable for storing an upper bank data received from each of the first and second banks in response to the corresponding input control signal, and for outputting the stored upper bank data as the upper preliminary output data in response to the output control signal,
   wherein the first pipe register and the second pipe register are enabled in response to a corresponding bank selection signal between the first bank selection signal and the second bank selection signal.

3. The data output circuit of claim 2, wherein each of the first pipe register and the second pipe register includes:
   a storage element including N registers suitable for sequentially storing a corresponding bank data between the lower bank data and the upper bank data in response to an Nth bit of the corresponding input control signal, and for sequentially outputting the stored bank data in response to an Nth bit of the output control signal; and
   an output enable element outputting data transferred from the N registers as a corresponding preliminary output data between the lower preliminary output data and the upper preliminary output data in response to the corresponding bank selection signal.

4. The data output circuit of claim 3, wherein the storage element further includes:
   N input switches that are turned on in response to an Nth bit of the corresponding input control signal and transfer the corresponding bank data to a corresponding register among the N registers; and
   N output switches that are turned on in response to the Nth bit of the output control signal and transfer the data stored in the corresponding register among the N registers to the output enable element.

5. The data output circuit of claim 1, wherein the data output unit includes:
   a driver suitable for driving the lower preliminary output data and for outputting the drove lower preliminary output data as the first output data; and
   a flip-flop suitable for synchronizing the upper preliminary output data with the clock and for outputting the synchronized upper preliminary output data as the second output data.

6. The data output circuit of claim 1, wherein the initialization unit includes:
   a first control signal generator suitable for generating the first bank control signal which is enabled in response to the bank address strobe signal, when the bank address signal representing the first bank is inputted; and
   a second control signal generator suitable for generating the second bank control signal which is enabled in response to the bank address strobe signal, when the bank address signal representing the second bank is inputted.

7. The data output circuit of claim 1, wherein the clock information reflecting unit;
   generates the first bank selection signal by performing an AND operation on the inverted output signal of the flip-flop unit and the clock, and
   generates the second bank selection signal by performing an AND operation on the output signal of the flip-flop unit and the clock.

8. A semiconductor memory device comprising:
- a page buffer group suitable for storing bank data received from a plurality of banks in response to a read command;
- a data output circuit that is enabled in response to a bank selection signal, for storing the bank data received from the page buffer group in response to an input control signal, and for outputting the stored bank data to an input/output pad in response to an output control signal, wherein a first bit group of the bank data is delayed by a predetermined time and transferred as a first output data while a second bit group of the bank data is synchronized with a clock and transferred as a second output data; and
- a control logic suitable for generating the input control signal and the output control signal for performing a data output operation, and generating the bank selection signal by reflecting information of the clock, wherein the control logic includes:
- a signal generation block suitable for generating a first bank selection signal and a second bank selection signal reflecting the information of the clock, and wherein the signal generation block includes:
- an initialization unit suitable for generating a first bank control signal and a second bank control signal based on a bank address signal and a bank address strobe signal;
- a flip-flop unit suitable for receiving the clock at a clock terminal, the first bank control signal at a reset terminal, an inverted signal of the second bank control signal at a set terminal, and an inverted output signal of the flip-flop unit at an input terminal; and
- a clock information reflecting unit suitable for generating the first bank selection signal and the second bank selection signal by reflecting the information of the clock into the inverted output signal and the output signal of the flip-flop unit.

9. The semiconductor memory device of claim 8, wherein the initialization unit includes:
- a first control signal generator suitable for generating the first bank control signal which is enabled in response to the bank address strobe signal, when the bank address signal representing the first bank is inputted; and
- a second control signal generator suitable for generating the second bank control signal which is enabled in response to the bank address strobe signal, when the bank address signal representing the second bank is inputted.

10. The semiconductor memory device of claim 8, wherein the clock information reflecting unit;
- generates the first bank selection signal by performing an AND operation on the inverted output signal of the flip-flop unit and the clock, and
- generates the second bank selection signal by performing an AND operation on the output signal of the flip-flop unit and the clock.

11. The semiconductor memory device of claim 8, wherein the data output circuit includes:
- a first data latch unit that is enabled in response to the first bank selection signal, for storing a first lower bank data and a first upper bank data in response to a first input control signal, and for outputting the stored first lower and upper bank data as a lower preliminary output data and an upper preliminary output data in response to the output control signal;
- a second data latch unit that is enabled in response to the second bank selection signal, for storing a second lower bank data and a second upper bank data in response to a second input control signal, and for outputting the stored second lower and upper bank data as the lower preliminary output data and the upper preliminary output data in response to the output control signal; and
- a data output unit suitable for driving the lower preliminary output data to send the first output data, and for synchronizing the upper preliminary output data with the clock to send the second output data.

12. The semiconductor memory device of claim 11, wherein each of the first data latch unit and the second data latch unit includes:
- a first pipe register for storing a lower bank data that is received from each of first and second banks in response to a corresponding input control signal, and outputting the stored lower bank data as the lower preliminary output data in response to the output control signal; and
- a second pipe register suitable for storing an upper bank data received from each of the first and second banks in response to the corresponding input control signal, and for outputting the stored upper bank data as the upper preliminary output data in response to the output control signal,
wherein the first pipe register and the second pipe register are enabled in response to a corresponding bank selection signal between the first bank selection signal and the second bank selection signal.

13. The semiconductor memory device of claim 12, wherein each of the first pipe register and the second pipe register includes:
- a storage element including N registers suitable for sequentially storing a corresponding bank data between the lower bank data and the upper bank data in response to an Nth bit of the corresponding input control signal, and for sequentially outputting the stored bank data in response to an Nth bit of the output control signal; and
- an output enable element suitable for outputting data transferred from the N registers as a corresponding preliminary output data between the lower preliminary output data and the upper preliminary output data in response to the corresponding bank selection signal.

14. The semiconductor memory device of claim 11, wherein the data output unit includes:
- a driver for driving the lower preliminary output data and outputting the drove lower preliminary output data as the first output data; and
- a flip-flop for synchronizing the upper preliminary output data with the clock and outputting the synchronized upper preliminary output data as the second output data.

15. The semiconductor memory device of claim 13, wherein the storage element further includes:
- N input switches that are turned on in response to an Nth bit of the corresponding input control signal and transfer the corresponding bank data to a corresponding register among the N registers; and
- N output switches that are turned on in response to the Nth bit of the output control signal and transfer the data stored in the corresponding register among the N registers to the output enable element.

16. A signal generation apparatus comprising:
- a first control signal generator suitable for generating a first control signal which is enabled in response to an address strobe signal, when an address signal representing a first bank is inputted;
a second control signal generation unit suitable for generating a second control signal which is enabled in response to the address strobe signal, when the address signal representing a second bank is inputted;
a flip-flop unit suitable for receiving a clock at a clock terminal, the first control signal at a reset terminal, an inverted signal of the second control signal at a set terminal, and an inverted output signal of the flip-flop unit at an input terminal; and
a clock information reflecting unit suitable for generating the first selection signal and the second selection signal by reflecting information of the clock into the inverted output signal and the output signal of the flip-flop unit.

17. The signal generation apparatus of claim 16, wherein the flip-flop unit operates in response to a falling edge of the clock.

18. The signal generation apparatus of claim 16, wherein the clock information reflecting unit;
generates the first selection signal by performing an AND operation on the inverted output signal of the flip-flop unit and the clock, and
generates the second selection signal by performing an AND operation on the output signal of the flip-flop unit and the clock.

* * * * *